(12) United States Patent
Seyama

(10) Patent No.: US 12,112,962 B2
(45) Date of Patent: Oct. 8, 2024

(54) ARRANGEMENT APPARATUS AND ARRANGEMENT METHOD

(71) Applicant: SHINKAWA LTD., Tokyo (JP)

(72) Inventor: Kohei Seyama, Tokyo (JP)

(73) Assignee: SHINKAWA LTD., Tokyo (JP)

( * ) Notice: Subject to any disclaimer, the term of this patent is extended or adjusted under 35 U.S.C. 154(b) by 587 days.

(21) Appl. No.: 17/599,535

(22) PCT Filed: Aug. 20, 2020

(86) PCT No.: PCT/JP2020/031466
§ 371 (c)(1),
(2) Date: Sep. 28, 2021

(87) PCT Pub. No.: WO2022/038745
PCT Pub. Date: Feb. 24, 2022

(65) Prior Publication Data
US 2022/0319885 A1    Oct. 6, 2022

(51) Int. Cl.
| | | |
|---|---|---|
| *H01L 21/67* | (2006.01) | |
| *G03F 7/00* | (2006.01) | |
| *H01L 21/02* | (2006.01) | |
| *H01L 21/60* | (2006.01) | |
| *H01L 21/68* | (2006.01) | |

(52) U.S. Cl.
CPC .... *H01L 21/67259* (2013.01); *G03F 7/70433* (2013.01); *G03F 7/70691* (2013.01); *H01L 21/02* (2013.01); *H01L 21/60* (2021.08); *H01L 21/681* (2013.01)

(58) Field of Classification Search
CPC . H01L 21/67259; H01L 21/681; H01L 21/02; H01L 21/60; G03F 7/70433; G03F 7/70691
See application file for complete search history.

(56) References Cited

U.S. PATENT DOCUMENTS

| 10,068,872 B2 * | 9/2018 | Takahashi | H01L 24/75 |
| 2006/0019468 A1 | 1/2006 | Beatty et al. | |
| 2008/0030701 A1 * | 2/2008 | Lof | G03F 9/7046 |
| | | | 355/53 |

(Continued)

FOREIGN PATENT DOCUMENTS

| JP | 2007158200 | 6/2007 |
| JP | 2008507844 | 3/2008 |

(Continued)

OTHER PUBLICATIONS

"International Search Report (Form PCT/ISA/210) of PCT/JP2020/031466," mailed on Nov. 24, 2020, pp. 1-3.

*Primary Examiner* — Michael M Trinh
(74) *Attorney, Agent, or Firm* — JCIPRNET

(57) ABSTRACT

An arrangement apparatus includes a stage, an arrangement part, and a control part. The stage supports a substrate. The arrangement part holds a die and arranges multiple dies on the substrate supported by the stage. The control part has a map data indicating arrangement positions of the dies and generated based on a positional relationship among patterns formed by an exposure apparatus, and controls, based on the map data, relative positions between the stage and the arrangement part when arranging the dies on the substrate.

8 Claims, 6 Drawing Sheets

(56) References Cited

U.S. PATENT DOCUMENTS

| | | | |
|---|---|---|---|
| 2011/0213479 A1* | 9/2011 | Wahlsten | G03F 9/7003 |
| | | | 700/97 |
| 2013/0032953 A1 | 2/2013 | Beatty et al. | |
| 2014/0078289 A1* | 3/2014 | Omori | H01L 21/67144 |
| | | | 382/103 |
| 2015/0228622 A1* | 8/2015 | Koyanagi | H01L 24/83 |
| | | | 257/777 |
| 2022/0199433 A1* | 6/2022 | Kobashi | H04N 23/80 |
| 2022/0199448 A1* | 6/2022 | Takahashi | G06T 7/0004 |

FOREIGN PATENT DOCUMENTS

| | | |
|---|---|---|
| WO | 2012133760 | 10/2012 |
| WO | 2014046052 | 3/2014 |

\* cited by examiner

ARRANGEMENT APPARATUS AND ARRANGEMENT METHOD

CROSS-REFERENCE TO RELATED APPLICATION

This application is a 371 application of the International PCT application serial no. PCT/JP2020/031466, filed on Aug. 20, 2020. The entirety of the above-mentioned patent application is hereby incorporated by reference herein and made a part of this specification.

BACKGROUND

Technical Field

The disclosure relates to an arrangement apparatus and an arrangement method.

Description of Related Art

Patent Document 1 describes a semiconductor fabrication technique. In this technique, wafers on which multiple semiconductor devices are formed are bonded to each other, and a connection electrode on one wafer and a connection electrode on another wafer are bonded to each other. Then, the wafers in the bonded state are separated into individual semiconductor devices by dicing.

RELATED ART

Patent Document(s)

Patent Document 1: Japanese Patent Application Laid-Open No. 2007-158200

SUMMARY

Problems to be Solved

When wafers are bonded to each other as in the technique described in Patent Document 1, for example, as the semiconductor devices formed respectively on the wafers also include defective products, the yield may decrease as a result. To solve this, the following method is conceivable: good dies diced from a wafer are rearranged on a substrate in correspondence to the original wafer, and the dies rearranged on the substrate are connected to another corresponding wafer. In that case, it is required to accurately rearrange the diced good dies on the substrate.

The disclosure provides an arrangement apparatus and an arrangement method capable of accurately arranging dies.

Means for Solving the Problems

An arrangement apparatus according to an embodiment of the disclosure is an apparatus which arranges multiple dies on a substrate in correspondence with multiple patterns so as to bond to a wafer having the patterns formed by an exposure apparatus. The arrangement apparatus includes a stage, an arrangement part, and a control part. The stage supports the substrate. The arrangement part holds the die and arranges the dies on the substrate supported by the stage. The control part has a map data indicating arrangement positions of the dies and generated based on a positional relationship among the patterns formed by the exposure apparatus, and controls, based on the map data, relative positions between the stage and the arrangement part when arranging the dies on the substrate.

In the arrangement apparatus described above, the relative positions between the stage and the arrangement part are controlled by the control part based on the map data, so that the die held by the arrangement part is arranged at a predetermined position on the substrate supported by the stage. The map data is based on the positional relationship among the patterns actually formed by the exposure apparatus. Therefore, the map data reflects the amount of deviation from the design position in the patterns formed by the exposure apparatus. As a result, according to the arrangement apparatus, the dies can be accurately arranged on the substrate.

Further, based on a deviation amount of positions between the dies and the patterns acquired in a state in which the dies arranged on the substrate and the wafer are bonded together, the control part may update the map data to cancel out the deviation amount. According to this configuration, the accuracy of the map data can be improved.

In each shot which includes the patterns, the exposure apparatus may form the patterns on the wafer. The map data may include a positional relationship among the shots. The control part may arrange the dies on the substrate based on the positional relationship among the shots. In this configuration, the data amount of the map data can be reduced.

An arrangement method according to an embodiment of the disclosure is a method of arranging multiple dies on a substrate so as to bond to a wafer on which multiple patterns corresponding to the dies are formed by an exposure apparatus. The arrangement method includes: a step of acquiring a map data indicating arrangement positions of the dies based on measurement of positions of the patterns on the wafer on which the patterns are formed by the exposure apparatus; and a step of arranging the dies on the substrate based on the acquired map data.

In the arrangement method described above, the dies are arranged at predetermined positions on the substrate based on the map data. The map data is acquired based on measurement of positions of the patterns actually formed by the exposure apparatus. Therefore, the map data reflects the amount of deviation from the design position in the patterns formed by the exposure apparatus. As a result, according to the arrangement method, the dies can be accurately arranged on the substrate.

Further, the arrangement method may further include: a step of acquiring a deviation amount of positions between the dies and the patterns in a state in which the dies arranged on the substrate and the wafer are bonded together; and a step of updating the map data to cancel out the deviation amount. According to this configuration, the accuracy of the map data can be improved.

In each shot which includes the patterns, the exposure apparatus may form the patterns on the wafer. The map data may include a positional relationship among the shots. In the arranging step, the dies may be arranged on the substrate based on the positional relationship among the shots. In this configuration, the data amount of the map data can be reduced.

Effects

According to an embodiment of the disclosure, an arrangement apparatus and an arrangement method capable of accurately arranging dies are provided.

DESCRIPTION OF THE EMBODIMENTS

Hereinafter, an arrangement apparatus and an arrangement method according to an example will be described in detail with reference to the accompanying drawings. In the description of the drawings, the same elements will be labeled with the same symbols, and repeated descriptions will be omitted.

The arrangement apparatus according to the disclosure is an apparatus for arranging multiple dies on a substrate with the mounting surfaces facing upward. Since the arrangement apparatus rearranges the dies obtained from dicing onto the substrate, the arrangement apparatus may also be referred to as a rearrangement apparatus. Such an arrangement apparatus may be used in part of a semiconductor chip fabrication process. In a semiconductor chip fabrication process according to an example, a wafer on which multiple circuit patterns are formed is prepared. The mounting surfaces of the dies rearranged on the substrate are respectively electrically connected to the circuit patterns formed on the wafer. By dicing the wafer to which the dies are connected, multiple semiconductor chips may be fabricated.

Figure 1:
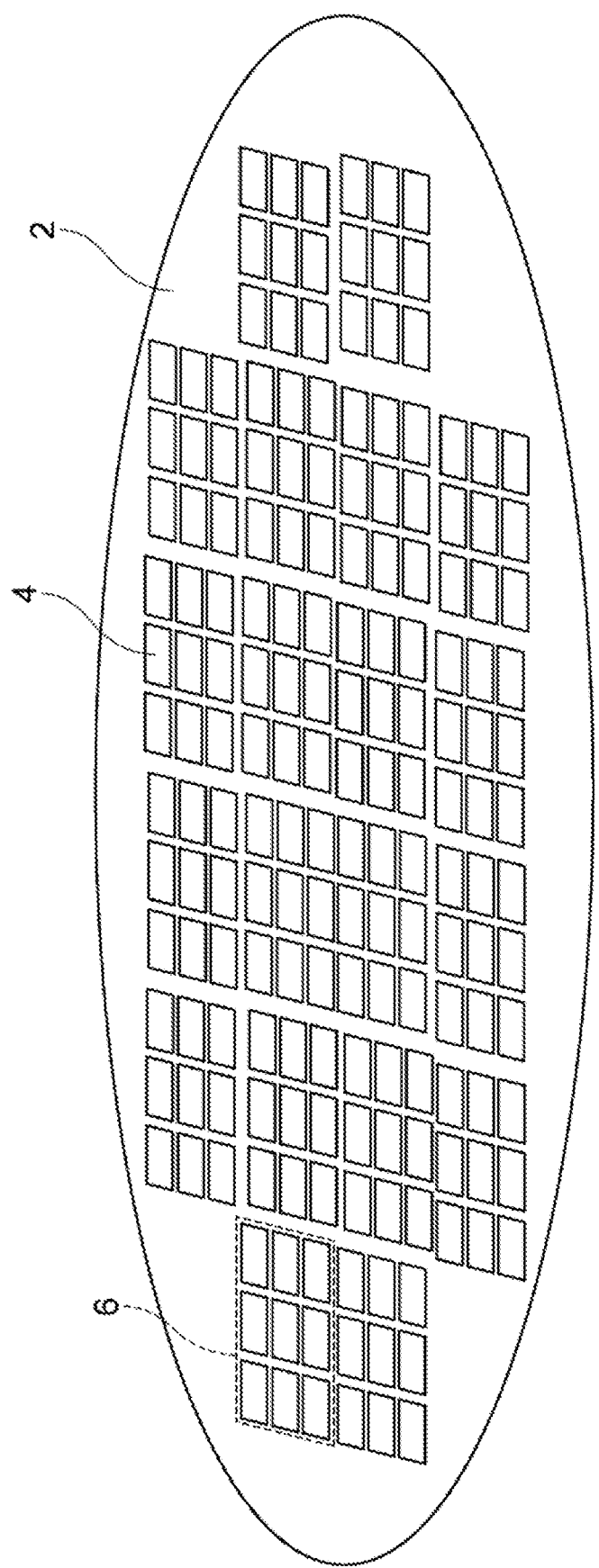
FIG. 1 is a perspective view schematically showing a wafer on which circuit patterns are formed by an exposure apparatus.
Figure 2:
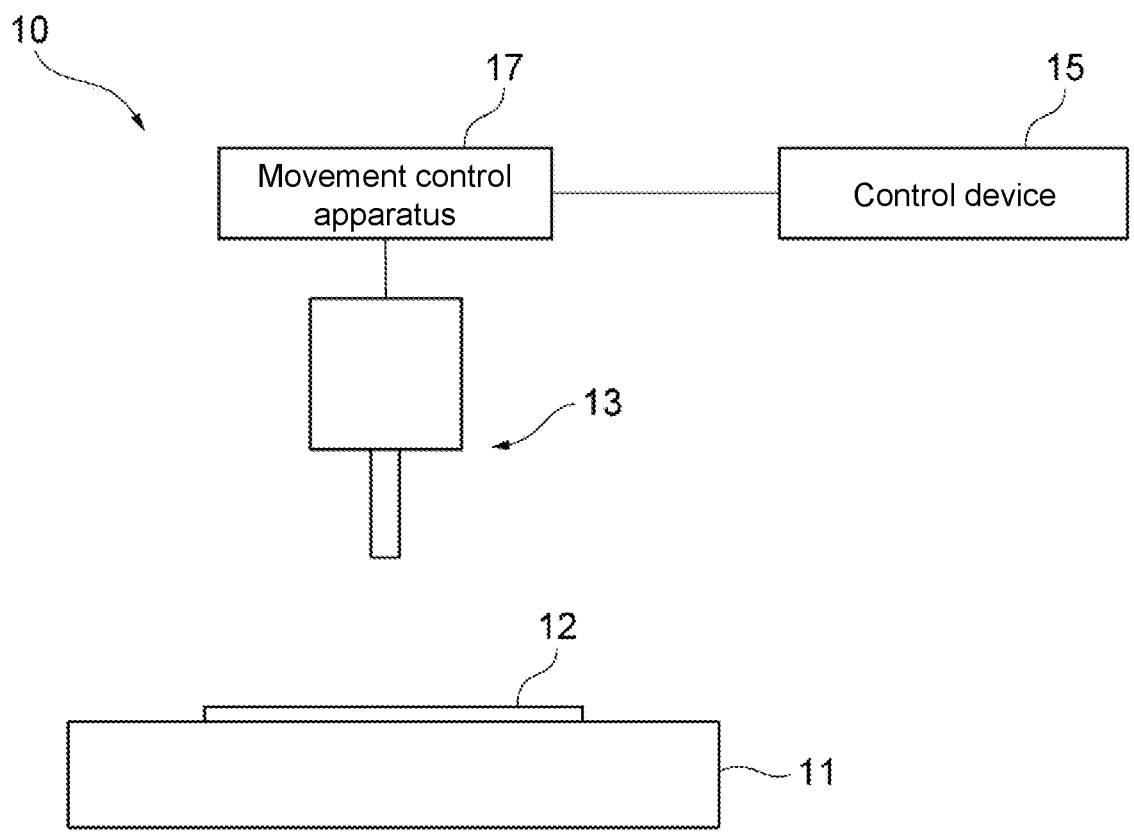
FIG. 2 is a schematic view showing an arrangement apparatus according to an example.

The accuracy of the position of the circuit pattern formed on the wafer depends on an exposure apparatus. FIG. 1 is a perspective view schematically showing a wafer on which circuit patterns corresponding to multiple dies are formed by an exposure apparatus. FIG. 2 is a schematic view showing an arrangement apparatus according to an example. In the disclosure, the exposure apparatus forms circuit patterns 4 on a wafer 2 in shot units. A shot may refer to a region that the exposure apparatus can expose at a time. In the illustrated example, nine circuit patterns 4 are formed in each shot 6 of the exposure apparatus. The exposure apparatus exposes the wafer 2 while shifting the position of the shot 6, for example, by moving a stage on which the wafer 2 is placed at a predetermined pitch. In that case, the positional relationship among the circuit patterns 4 included in one shot 6 depends on the pattern mask of the exposure apparatus and thus does not change. On the other hand, since the positions of the shots 6 depend on the accuracy of the pitch of the stage, a slight deviation may occur. In other words, the position of the circuit pattern 4 formed on the wafer 2 may deviate from a design position. Therefore, the arrangement apparatus 10 arranges multiple dies 14 on a substrate 12 so as to correspond to the positions of the circuit patterns 4 actually formed on the wafer 2.

As shown in FIG. 2, the arrangement apparatus 10 includes a stage 11, a mounting head (arrangement part) 13, and a control device (control part) 15. The stage 11 supports the substrate 12 at a predetermined position on the substrate 12. Multiple dies 14 are arranged on the substrate 12 by the arrangement apparatus 10. For example, the substrate 12 may be a glass substrate, a silicon substrate, etc. Further, the substrate 12 may have the same shape as the wafer 2 to be bonded. The substrate 12 in the illustrated example has a disk shape.

The mounting head 13 may sequentially hold each of the dies 14 to arrange the dies 14 on the substrate 12 supported by the stage 11. The mounting head 13 according to an example may adsorb and hold the die 14 by a mechanical operation. The mounting head 13 of the illustrated example is supported by a movement control apparatus 17. The movement control apparatus 17 may be an apparatus that controls the movement of the mounting head in the X-axis direction, the Y-axis direction, and the Z-axis direction.

For example, the movement control apparatus 17 may be configured to include a Z-axis moving mechanism which supports the mounting head and moves the mounting head in the Z-axis direction, a Y-axis moving mechanism which supports the Z-axis moving mechanism and moves the Z-axis moving mechanism in the Y-axis direction, and an X-axis moving mechanism which supports the Y-axis moving mechanism and moves the Y-axis moving mechanism in the X-axis direction.

In that case, the Z-axis moving mechanism according to an example includes a guide rail extending along the Z-axis direction, and a base supported by the guide rail and moving along the Z-axis direction to support the mounting head. The Y-axis moving mechanism according to an example includes a guide rail extending along the Y-axis direction, and a base supported by the guide rail and moving along the Y-axis direction to support the Z-axis moving mechanism. The X-axis moving mechanism according to an example includes a guide rail extending along the X-axis direction, and a base supported by the guide rail and moving along the X-axis direction to support the Y-axis moving mechanism.

The control device 15 includes a computer and electronic circuits connected to the computer, and executes an operation control of the arrangement apparatus 10 by executing a predetermined program by a CPU. For example, the control device 15 controls relative positions between the stage 11 and the mounting head 13 based on a map data. By controlling the operation of the movement control apparatus 17, the control device 15 according to an example controls the position of the mounting head 13 to be a position corresponding to the map data. Further, by controlling the operation of the mounting head 13, the control device 15 arranges the adsorbed/held die 14 to a position on the substrate 12 corresponding to the map data. For example, an adhesive layer for detachably adhering the die 14 may be formed on the substrate 12, and the die 14 arranged on the substrate 12 may be temporarily fixed to the substrate 12. Further, an adhesive layer may also be formed on the die 14 to temporarily fix the die 14 to the substrate 12.

The map data is a data indicating arrangement positions of the dies 14 arranged on the substrate 12. The map data is generated based on a circuit pattern data indicating the positional relationship among the circuit patterns 4 on the wafer 2 actually formed by the exposure apparatus. The circuit pattern data directly or indirectly includes a data of relative positions among the circuit patterns 4, and for example, may specify the positions of all other circuit patterns 4 when the position of one circuit pattern 4 is specified.

For example, the circuit pattern data may be a data indicating a positional relationship among the respective centers of the circuit patterns (patterns) 4 actually formed on the wafer 2. Further, as described above, the circuit patterns 4 are formed by the exposure apparatus in shot units. Therefore, for example, the circuit pattern data may be a data indicating a positional relationship among the centers of the shots (patterns) 6 on the wafer 2. Further, the circuit pattern data may be a data indicating positions of the circuit patterns 4 or the shots 6 with respect to a reference position (e.g., the center) of the wafer 2. In that case, the circuit pattern data may specify the positions of all the circuit patterns 4 when the reference position is specified. Further, the circuit pattern data may be a data indicating a deviation amount between a position of the circuit pattern of the as-designed wafer and a position of the circuit pattern 4 of the actually formed wafer 2.

The circuit pattern data according to an example may be acquired by measuring the positions of the circuit patterns 4 formed on the wafer 2 by using, for example, a measuring device including a microscope. Generally, the position deviation of the shots 6 due to the exposure apparatus is reproducible. Therefore, in the arrangement apparatus 10 in the disclosure, the circuit pattern data corresponding to the same type of wafer may be acquired once only.

Figure 3:
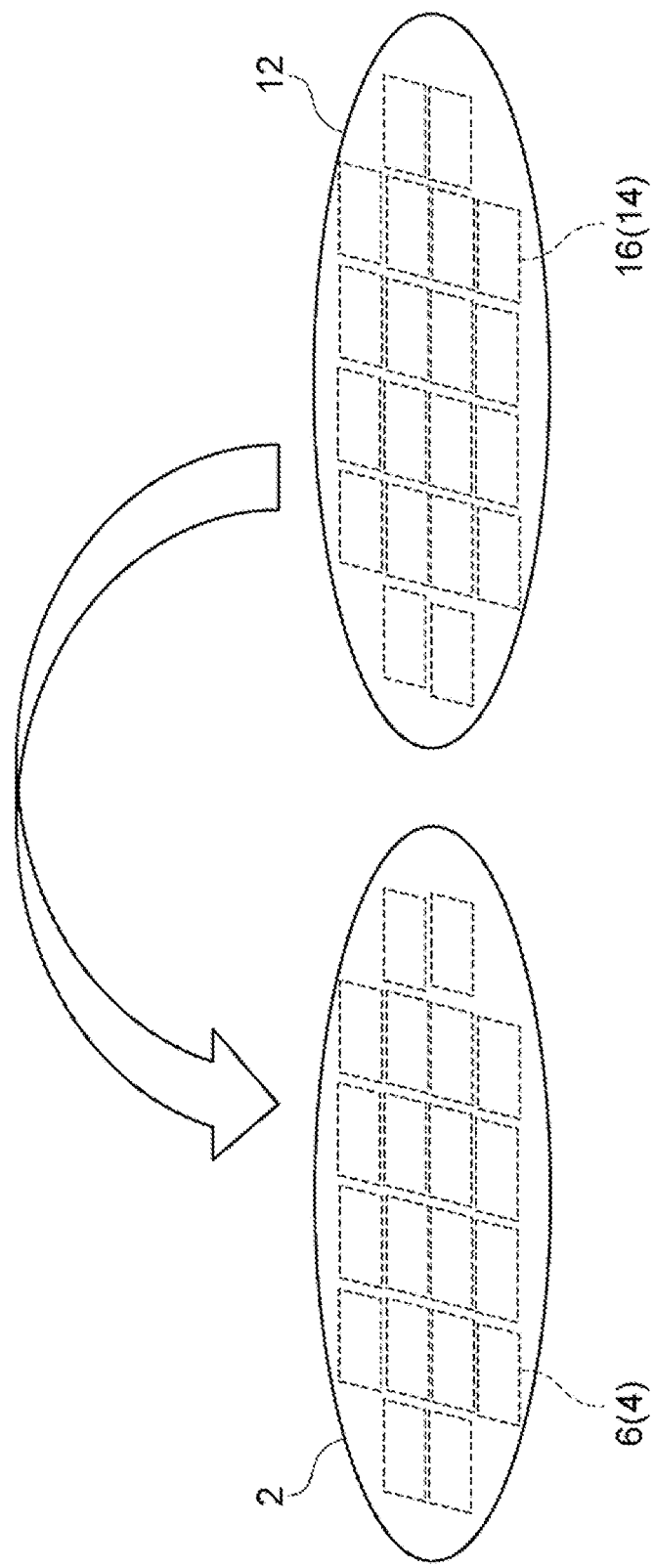
FIG. 3 is a view showing a relationship between a wafer and dies arranged on a substrate.

The map data may be generated based on the circuit pattern data. As described above, the circuit pattern data indicates the positional relationship among the circuit patterns 4 on the wafer 2. In the disclosure, the wafer 2 and the dies on the substrate 12 are bonded together so that the circuit patterns 4 formed on the wafer 2 and the dies 14 arranged on the substrate 12 are accurately connected to each other. FIG. 3 is a view showing a relationship between the circuit patterns of the wafer and the dies arranged on the substrate. As described above, since the positions of the circuit patterns in one shot do not change, in FIG. 3, the circuit patterns 4 formed on the wafer 2 are drawn in shot units, and the dies 14 arranged on the substrate 12 are drawn in the unit of regions 16 corresponding to the shots. As shown in FIG. 3, the positions of the shots 6 (i.e., the circuit patterns 4) which may be indicated by the circuit pattern data and the positions of the regions 16 (i.e., the dies 14) which may be indicated by the map data are in a relationship of mirror symmetry (line symmetry) with respect to each other.

The map data according to an example may be a data indicating a positional relationship among the respective centers of the dies 14 arranged on the substrate 12. Further, the map data may be a data indicating positions of the dies 14 with respect to a reference position (e.g., the center) of the substrate 12. Further, the map data may be a data indicating an amount of deviation of the die 14 on the substrate 12 from an as-designed arrangement position. The as-designed arrangement position of the die 14 may be a position corresponding to the position of the circuit pattern of the as-designed wafer, i.e., a position in a mirror-symmetrical relationship with the position of the circuit pattern of the as-designed wafer.

The control device 15 according to an example may update the map data after executing the arrangement of the dies 14 based on the acquired map data. Even if the dies are arranged based on the map data, it is likely that a deviation (error) may occur between the position of the circuit pattern 4 of the wafer 2 and the position of the arranged die 14 due to a pitch deviation of the movement control apparatus 17 or the like. Therefore, the map data may be updated to cancel out the deviation amount.

The positional deviation amount between the dies 14 and the circuit patterns 4 may be acquired by using, for example, a measuring device including an infrared microscope in a state in which the dies 14 arranged on the substrate 12 and the wafer 2 are bonded together. The deviation amount may be a difference between the respective center positions of the dies 14 and the respective center positions of the circuit patterns 4 when viewed from the thickness direction of the wafer 2. The map data updated based on the deviation amount may be inputted to the control device 15, or the existing map data may be updated by the control device 15 to which the deviation amount data is inputted.

Figure 4:
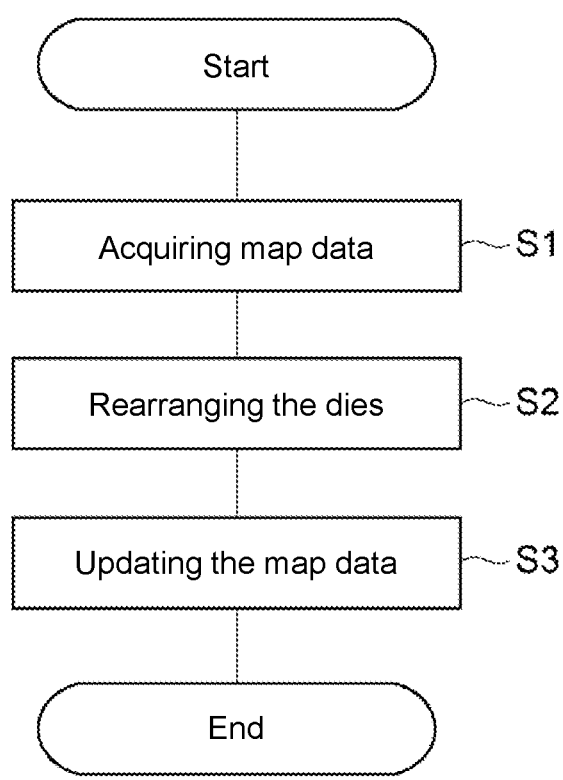
FIG. 4 is a flowchart showing an arrangement method using the arrangement apparatus.

Next, a series of operations based on an arrangement method will be described. FIG. 4 is a flowchart showing an arrangement method according to an example. In the arrangement method according to an example, first, by measuring positions of multiple circuit patterns 4 on a wafer 2 on which the circuit patterns 4 are formed, a circuit pattern data indicating a positional relationship among the circuit patterns 4 is acquired. Then, a map data indicating arrangement positions of multiple dies 14 is acquired based on the acquired circuit pattern data (step S1). As described above, since the position of the circuit pattern 4 based on the circuit pattern data and the position of the die 14 based on the map data are in a mirror-symmetrical relationship, the map data may be acquired by converting the circuit pattern data by a predetermined calculation. The acquired map data may be inputted to the control device 15 of the arrangement apparatus 10. The acquired circuit pattern data may also be inputted to the control device 15 for the control device 15 to generate the map data.

Next, based on the acquired map data, multiple dies 14 are arranged on the substrate 12 (step S2). In other words, by controlling the movement control apparatus 17 based on the map data, the control device 15 arranges the dies 14 at positions on the substrate 12 corresponding to the map data. Afterwards, the substrate 12, on which the dies 14 are arranged, is taken out from the arrangement apparatus 10 and is bonded with the wafer 2 so that the dies 14 and the corresponding circuit patterns 4 are electrically connected to each other. By dicing the wafer 2 to which multiple dies 14 are connected, multiple semiconductor chips may be fabricated.

The map data may be updated when the positional deviation between the dies 14 and the circuit patterns 4 bonded to each other is large (step S3). The positional deviation amount, as described above, may be acquired by using a measuring device including an infrared microscope in a state in which the dies 14 arranged on the substrate 12 and the wafer 2 are bonded together. In other words, it is acquired before dicing the wafer 2 to which the dies 14 are connected. Then, the map data is updated to cancel out the acquired deviation amount, and the updated map data will be used for the arrangement operation next time.

As described above, the arrangement apparatus 10 according to an example is an apparatus which arranges multiple dies 14 on a substrate 12 in correspondence with multiple circuit patterns 4 so as to bond to a wafer 2 having the circuit patterns 4 formed by an exposure apparatus. The arrangement apparatus 10 includes a stage 11, a mounting head 13, and a control device 15. The stage 11 supports the substrate 12. The mounting head 13 holds each of the dies 14 to arrange the dies 14 on the substrate 12 supported by the stage 11. The control device 15 controls relative positions between the stage 11 and the mounting head 13 when the dies 14 are arranged on the substrate 12, based on a map data which indicates arrangement positions of the dies 14 and is generated based on a positional relationship among the circuit patterns 4 on the actual wafer 2.

In that case, the arrangement method includes the following steps. A map data indicating arrangement positions of multiple dies 14 is acquired based on measurement of positions of multiple circuit patterns 4 on a wafer 2 on which the circuit patterns 4 are formed by an exposure apparatus. The dies 14 are arranged on the substrate 12 based on the acquired map data.

In the arrangement apparatus 10 and the arrangement method described above, the relative positions between the stage 11 and the mounting head 13 are controlled by the control device 15 based on the map data, so that the die 14 held by the mounting head 13 is arranged at a predetermined position on the substrate 12 supported by the stage 11. The map data is based on the positional relationship among the circuit patterns 4 on the wafer 2 actually formed by the exposure apparatus. Therefore, the map data reflects the amount of deviation from the design position in the circuit patterns 4 formed by the exposure apparatus. As a result, according to the arrangement apparatus 10, the dies can be accurately arranged on the substrate 12.

Further, based on a deviation amount of positions between the dies 14 and the circuit patterns 4 acquired in a state in which the dies 14 arranged on the substrate 12 and the wafer 2 are bonded together, the control device 15 may update the map data to cancel out the deviation amount. In that case, the deviation amount of positions between the dies 14 and the circuit patterns 4 is acquired in a state in which the dies 14 arranged on the substrate 12 and the wafer 2 are bonded together, and the map data is updated to cancel out the acquired deviation amount. Even if the arrangement of the dies 14 is executed by using the map data generated based on measurement of the wafer 2, it is likely that a positional deviation still occurs between the dies 14 and the circuit patterns 4 when the dies 14 arranged on the substrate 12 and the wafer 2 are bonded together. As described above, by updating the map data using the actually measured deviation amount, the accuracy of the map data can be improved.

Further, the map data may include a positional relationship among the shots 6, and the control device 15 may arrange the dies 14 on the substrate 12 based on the positional relationship among the shots 6. In this configuration, the data amount of the map data can be reduced.

Although the form of the arrangement apparatus has been described above, the configuration of the arrangement apparatus is not limited to the described form.

Figure 5:
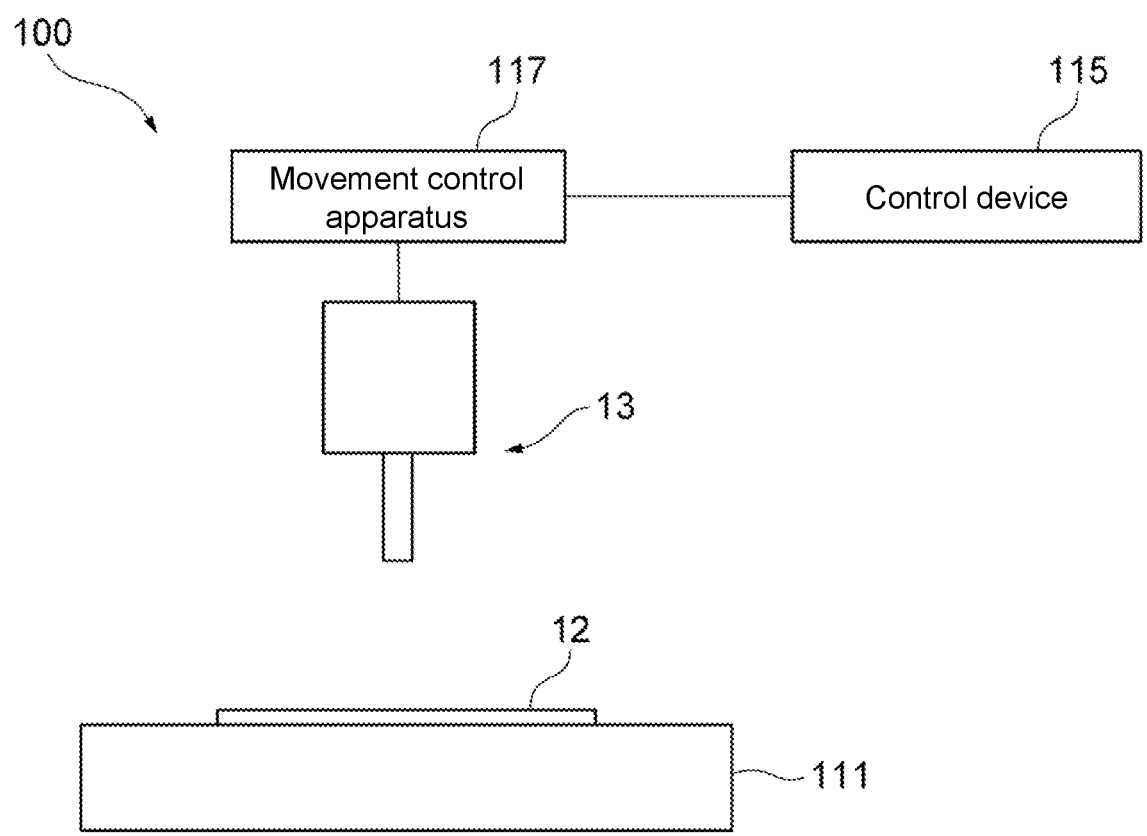
FIG. 5 is a schematic view showing an arrangement apparatus according to another example.

For example, in the arrangement apparatus, it would suffice if the relative positional relationship between the substrate on the stage and the mounting head is controllable. For example, FIG. 5 shows an arrangement apparatus 100 according to another example. The arrangement apparatus 100 includes a stage 111 which supports a substrate 12, a movement control apparatus 117 which supports a mounting head 13, and a control device (control part) 115. The stage 111 supports the substrate 12 at a predetermined position on the substrate 12. Further, the stage 111 is a so-called XY movement stage and is capable of a movement control in the X-axis direction and the Y-axis direction. The movement control apparatus 117 has a Z-axis moving mechanism which moves the mounting head in the Z-axis direction. The control device 115 controls the position of the stage 111 in the X-axis direction and in the Y-axis direction, and controls the position of the mounting head 13 by an operation control of the movement control apparatus 117. Accordingly, the control device 115 controls the relative positions between the stage 111 and the mounting head 13 based on the map data.

Figure 6:
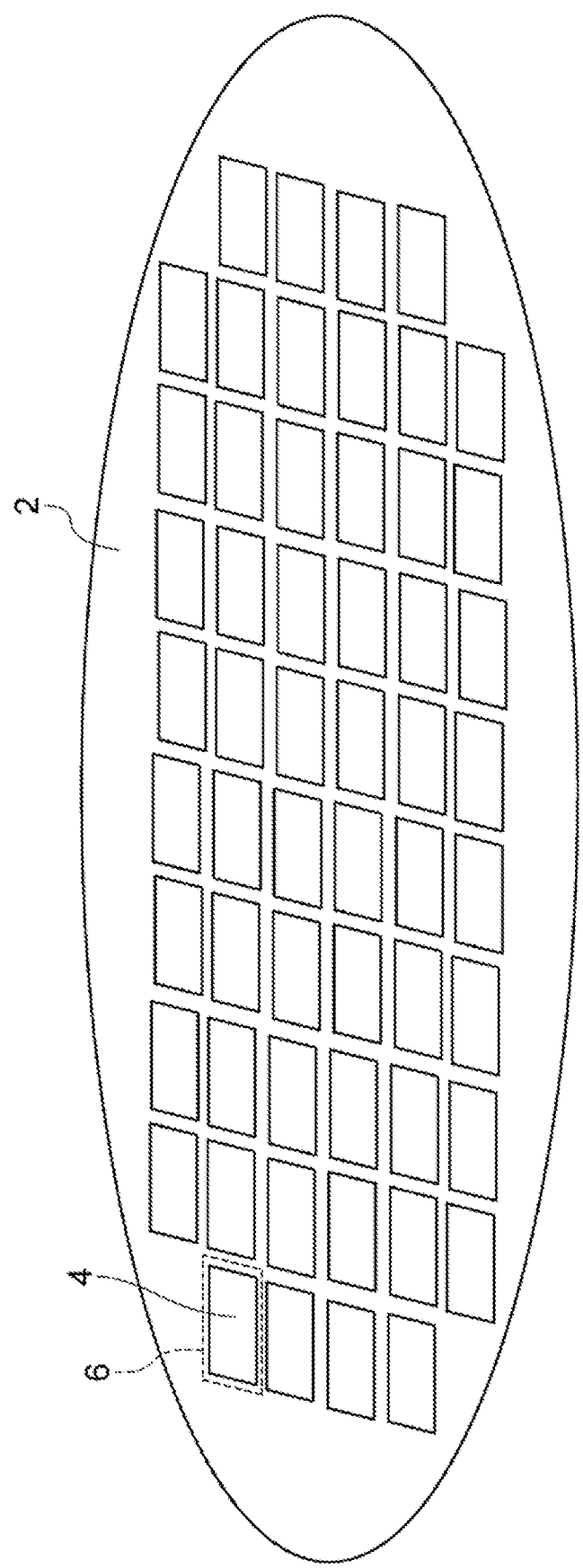
FIG. 6 is a perspective view schematically showing a wafer on which circuit patterns are formed by another exposure apparatus.

Further, although it has been shown that the exposure apparatus forms multiple circuit patterns 4 on the wafer 2 in one shot, the number of circuit patterns 4 of each shot in the exposure apparatus is not particularly limited. FIG. 6 is a perspective view schematically showing a wafer 2 on which circuit patterns 4 are formed by another exposure apparatus. As shown in FIG. 6, the exposure apparatus may form one circuit pattern 4 on the wafer 2 in one shot 6. In other words, the number of circuit patterns 4 included in one shot 6 may be one. In that case, the control device 15 may control the positions at which the dies 14 are arranged on the substrate 12 for each shot based on the map data.

What is claimed is:

1. An arrangement apparatus which arranges a plurality of dies on a substrate in correspondence with a plurality of patterns so as to bond to a wafer having the patterns formed by an exposure apparatus, the arrangement apparatus comprising:
    a stage which supports the substrate;
    an arrangement part which holds the die and arranges the dies on the substrate supported by the stage; and
    a control part which has a map data indicating arrangement positions of the dies and generated based on a positional relationship among the patterns formed by the exposure apparatus, and controls, based on the map data, relative positions between the stage and the arrangement part when arranging the dies on the substrate.

2. The arrangement apparatus according to claim 1, wherein, based on a deviation amount of positions between the dies and the patterns acquired in a state in which the dies arranged on the substrate and the wafer are bonded together, the control part updates the map data to cancel out the deviation amount.

3. The arrangement apparatus according to claim 1, wherein
    in each shot which comprises the patterns, the exposure apparatus forms the patterns on the wafer,
    the map data comprises a positional relationship among the shots, and
    the control part arranges the dies on the substrate based on the positional relationship among the shots.

4. The arrangement apparatus according to claim 2, wherein
    in each shot which comprises the patterns, the exposure apparatus forms the patterns on the wafer,
    the map data comprises a positional relationship among the shots, and
    the control part arranges the dies on the substrate based on the positional relationship among the shots.

5. An arrangement method of arranging a plurality of dies on a substrate in correspondence with a plurality of patterns so as to bond to a wafer having the patterns formed by an exposure apparatus, the arrangement method comprising:
    a step of acquiring a map data indicating arrangement positions of the dies based on measurement of positions of the patterns on the wafer on which the patterns are formed by the exposure apparatus; and
    a step of arranging the dies on the substrate based on the acquired map data.

6. The arrangement method according to claim 5, further comprising:
    a step of acquiring a deviation amount of positions between the dies and the patterns in a state in which the dies arranged on the substrate and the wafer are bonded together; and
    a step of updating the map data to cancel out the deviation amount.

7. The arrangement method according to claim 5, wherein
in each shot which comprises the patterns, the exposure apparatus forms the patterns on the wafer,
the map data comprises a positional relationship among the shots, and
in the arranging step, the dies are arranged on the substrate based on the positional relationship among the shots.

8. The arrangement method according to claim 6, wherein
in each shot which comprises the patterns, the exposure apparatus forms the patterns on the wafer,
the map data comprises a positional relationship among the shots, and
in the arranging step, the dies are arranged on the substrate based on the positional relationship among the shots.

* * * * *